(12) United States Patent
Kim et al.

(10) Patent No.: US 8,598,645 B2
(45) Date of Patent: Dec. 3, 2013

(54) SYSTEM AND METHOD FOR IMPROVING MESA WIDTH IN A SEMICONDUCTOR DEVICE

(75) Inventors: Unsoon Kim, San Jose, CA (US);
Angela T. Hui, Fremont, CA (US);
Yider Wu, Campbell, CA (US);
Kuo-Tung Chang, Saratoga, CA (US);
Hiroyuki Kinoshita, San Jose, CA (US)

(73) Assignees: Spansion LLC, Sunnyvale, CA (US);
Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/910,331

(22) Filed: Oct. 22, 2010

(65) Prior Publication Data

US 2011/0037115 A1 Feb. 17, 2011

Related U.S. Application Data

(62) Division of application No. 11/193,409, filed on Aug. 1, 2005, now Pat. No. 7,842,618.

(51) Int. Cl.
*H01L 29/788* (2006.01)

(52) U.S. Cl.
USPC .................... 257/314; 257/315; 257/316

(58) Field of Classification Search
USPC .................... 257/314–316, E29.3
See application file for complete search history.

(56) References Cited

U.S. PATENT DOCUMENTS

| 6,162,683 | A | 12/2000 | Chen |
| 6,235,609 | B1 | 5/2001 | Sengupta et al. |
| 6,664,191 | B1 | 12/2003 | Kim et al. |
| 2001/0019508 | A1* | 9/2001 | Shimizu et al. ............... 365/203 |
| 2003/0209755 | A1 | 11/2003 | Chang et al. |
| 2004/0147090 | A1 | 7/2004 | Kim et al. |
| 2005/0035394 | A1* | 2/2005 | Mori ............................ 257/314 |
| 2005/0287731 | A1* | 12/2005 | Bian et al. ..................... 438/201 |

OTHER PUBLICATIONS

Co-pending U.S. Appl. No. 11/193,409, filed Aug. 1, 2005 entitled "System and Method for Improving Mesa width in a Semiconductor Device" by Unsoon Kim et al., 39 pages.
Kim et al., "New STI Scheme to Compensate Gate Oxide Thinning at STI Corner Edge for the Devices Using Thick Dual Gate Oxide," vol. 2001, Sep. 26, 2001, pp. 194-195, XP001074548.
International Search Report and Written Opinion dated May 7, 2007.
2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

*Primary Examiner* — Tran Tran
(74) *Attorney, Agent, or Firm* — Harrity & Harrity, LLP

(57) ABSTRACT

A method for forming a memory device is provided. A nitride layer is formed over a substrate. The nitride layer and the substrate are etched to form a trench. The nitride layer is trimmed on opposite sides of the trench to widen the trench within the nitride layer. The trench is filled with an oxide material. The nitride layer is stripped from the memory device, forming a mesa above the trench.

20 Claims, 18 Drawing Sheets

SYSTEM AND METHOD FOR IMPROVING MESA WIDTH IN A SEMICONDUCTOR DEVICE

RELATED APPLICATION

This application is a divisional of U.S. patent application Ser. No. 11/193,409, filed Aug. 1, 2005, which is incorporated herein by reference.

TECHNICAL FIELD

The present invention relates generally to semiconductor manufacturing and, more particularly, to fabrication of memory devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells are erased together as a block.

Flash memory devices of this type may include individual memory cells characterized by a vertical stack of a tunnel oxide (e.g., SiO$_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

Memory cells in a flash memory device are typically connected in an array of rows and columns, with the control gates of the cells in a row being connected to a respective word line and the drains of the cells in a column being connected to a respective bit line. To operate efficiently and reliably, each cell is effectively isolated from neighboring cells.

As the dimensions of such memory devices have shrunk, isolation techniques have transitioned from conventional local oxidation of silicon ("LOCOS") isolation techniques to shallow trench isolation ("STI"). In fabricating an STI structure, a trench is created in the substrate between active regions of neighboring cells. The trench is filled with a field oxide (FOX) material that isolates neighboring cells from each other. During processing, the FOX material may be formed into a raised surface or platform (relative to the substrate) between neighboring isolation regions. This platform may be referred to as the "mesa" on which each memory cell in the flash memory device may be formed. Unfortunately, conventional STI fabrication techniques fail to provide suitable mesa widths. Accordingly, there is a need for an improved structure and fabrication technique for optimizing performance of flash memory devices.

DISCLOSURE OF THE INVENTION

In an implementation consistent with the principles of the invention, a method is provided for forming a memory device. The method includes forming a nitride layer over a substrate; etching the nitride layer and the substrate to form a trench; trimming the nitride layer on opposite sides of the trench to widen the trench within the nitride layer; and filling the trench with an oxide material.

In another implementation consistent with the principles of the invention, a memory device is provided. The memory device includes a substrate having at least one isolation trench formed therein; a tunnel oxide formed over the substrate; an oxide material formed in the trench and having a portion extending above an upper surface of the tunnel oxide, where the portion extending above the upper surface of the substrate forms a mesa having a width of at least 35 nm; a floating gate formed over the tunnel oxide; and a control gate formed over the floating gate.

In yet another implementation consistent with the principles of the invention, a method is provided for forming a semiconductor device. The method includes forming a first oxide layer over a substrate; depositing a nitride layer over the first oxide layer; patterning a photoresist material to form a trench mask over the nitride layer; etching at least one isolation trench within the substrate, first oxide layer, and nitride layer; removing the trench mask; removing at least a portion of the nitride layer adjacent to a sidewall of the at least one isolation trench, to widen the isolation trench in the nitride layer; forming a second oxide layer in the at least one isolation trench; filling the at least one isolation trench with a third oxide material; and removing the nitride layer to form at least one mesa from the third oxide material extending above each of the at least one isolation trenches.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
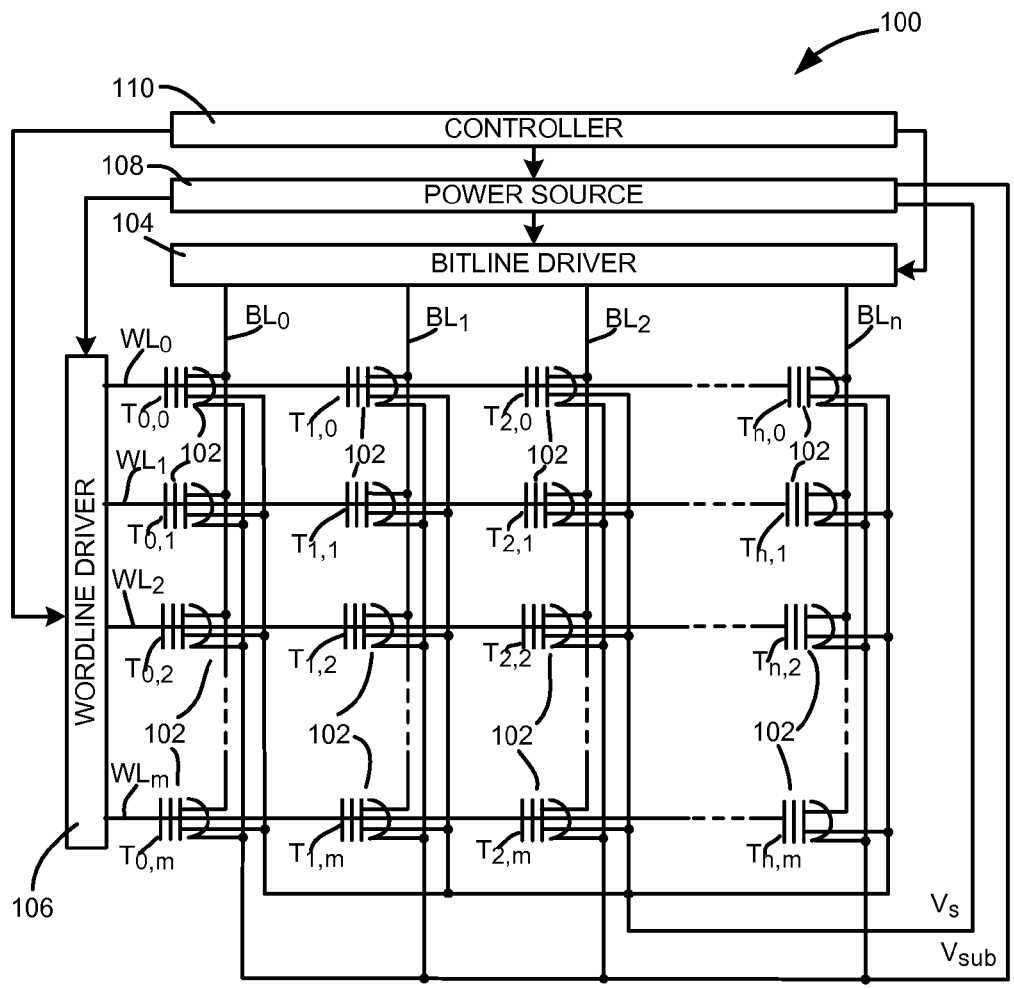
FIG. 1 illustrates an exemplary configuration of a flash EEPROM 100 formed in accordance with an embodiment of the invention.

Implementations consistent with principles of the invention provide non-volatile memory devices having improved field oxide mesa widths, such as flash electrically erasable programmable read only memory (EEPROM) devices. FIG. 1 illustrates an exemplary configuration of a flash EEPROM 100 formed in accordance with an embodiment of the invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. Controller 110 may also control drivers 104 and 106 to address the memory cells individually or collectively.

A memory cell 102 is located at each junction of a word line and a bit line. In one implementation, each cell 102 includes a Metal-Oxide-Semiconductor (MOS) Field Effect Transistor (FET) having a source and drain formed in a semiconductor substrate, a floating gate, and a control gate separated from the floating gate by an intergate dielectric. Additional details regarding the formation of cell 102 will be described below in relation to FIGS. 2-25. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to power source 108.

In addition to a core memory array, as describe above, a flash memory device may also include a peripheral microcontroller circuit formed on a portion of the flash memory device adjacent to the core memory array. Many high voltage transistors are used in the peripheral circuit to produce the voltage required to program/erase the core memory cells.

Exemplary Processing

Figure 2A:
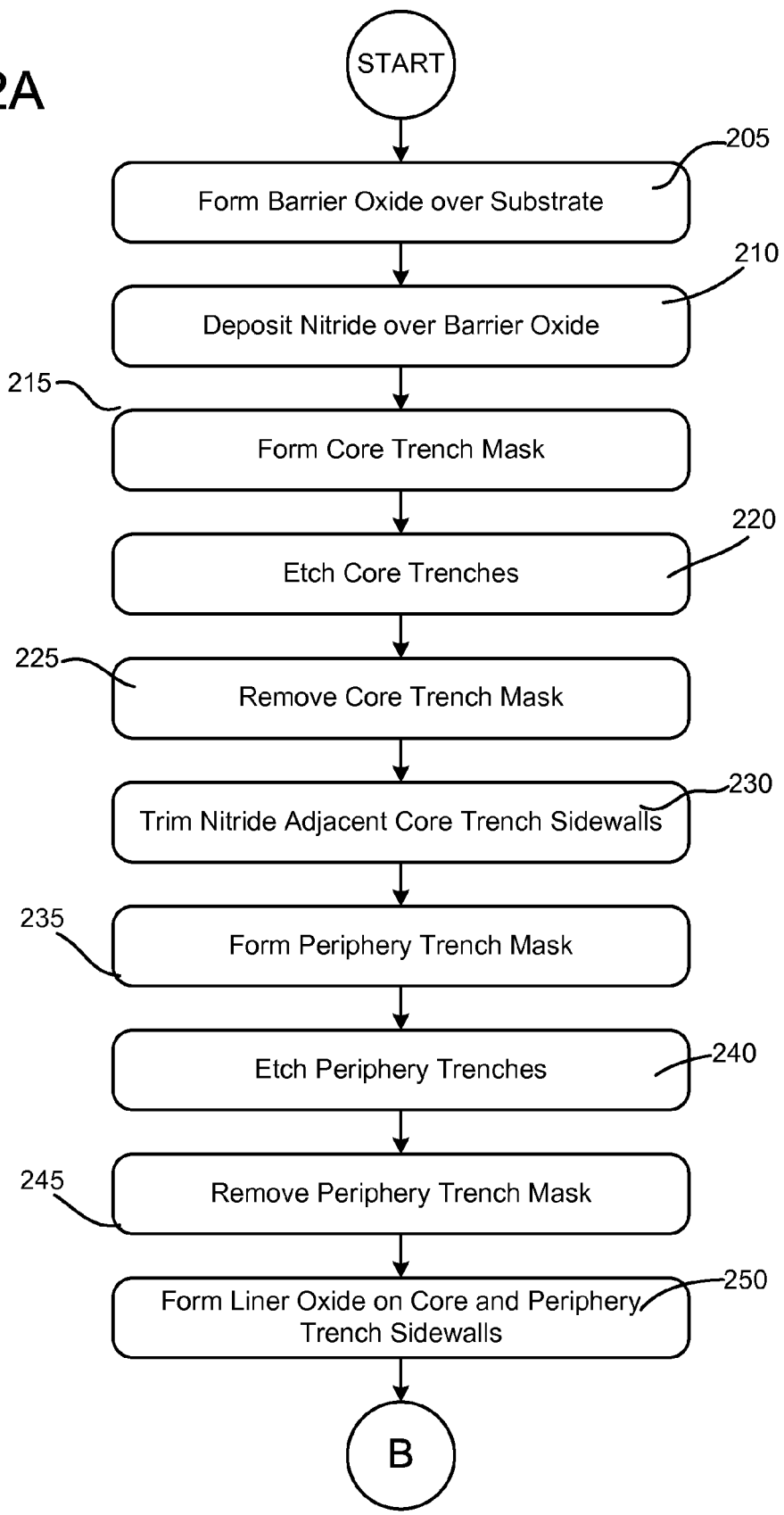
FIGS. 2A-2B are flow diagrams illustrating an exemplary process for forming a semiconductor memory device in an implementation consistent with the principles of the invention.
Figure 2B:
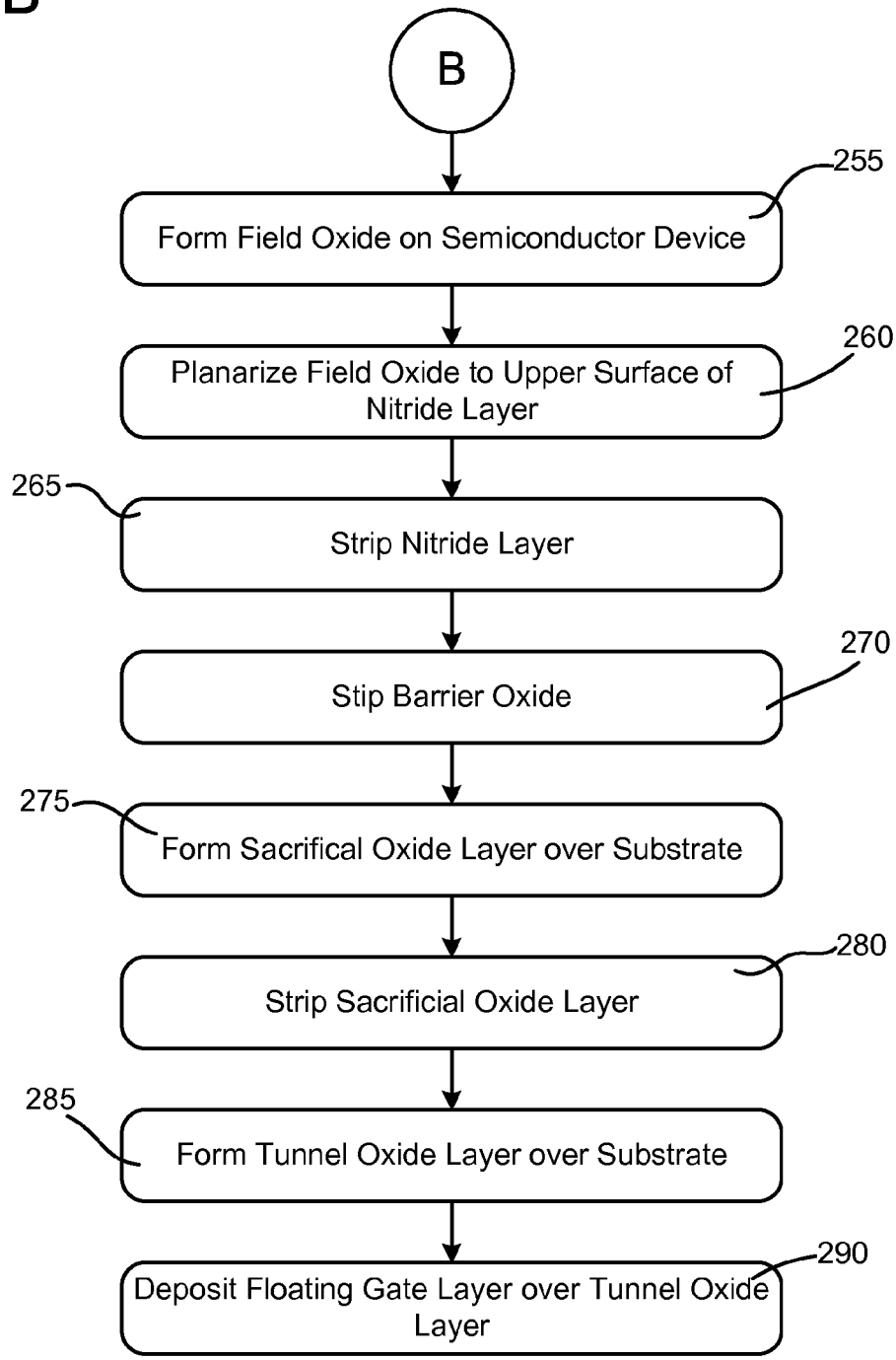

FIGS. 2A-2B illustrate an exemplary process for forming a semiconductor memory device in an implementation consistent with the principles of the invention. In one implementation, the semiconductor memory device includes an array of memory cells of a flash memory device, such as that illustrated in FIG. 1. FIGS. 3-19 illustrate exemplary views of a semiconductor memory device fabricated according to the processing described in FIGS. 2A-2B.

Figure 3:
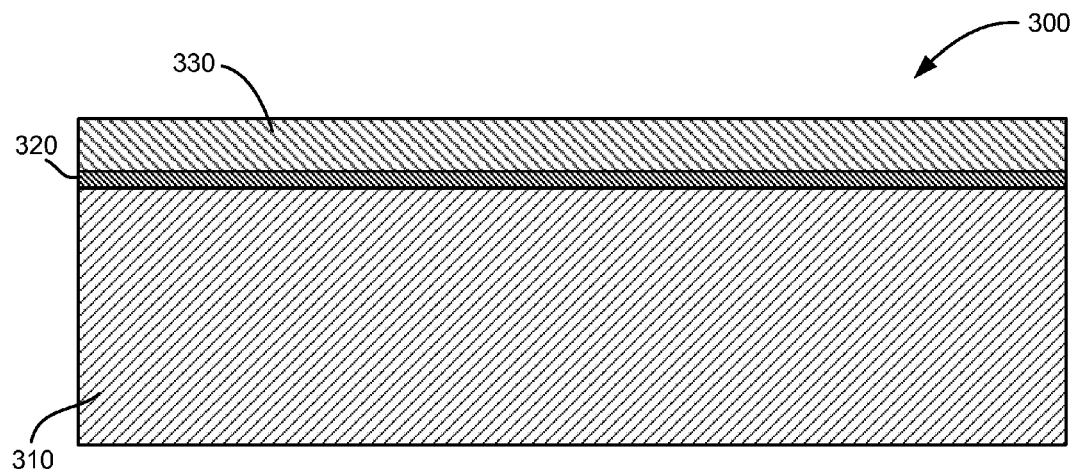
FIGS. 3-19 illustrate exemplary views of a semiconductor memory device fabricated according to the processing described in FIGS. 2A-2B.

With reference to FIGS. 2A and 3, processing may begin with a semiconductor device 300 that includes layers 310, 320, and 330. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be a barrier oxide formed on layer 310 in a conventional manner (act 205). In an exemplary implementation, barrier oxide layer 320 may include an oxide, such as a silicon oxide (e.g., $SiO_2$), and may have a thickness ranging from about 50 Å to about 350 Å. In one implementation consistent with principles of the invention, a suitable method for forming layer 320 may be a thermal oxidation process of layer 310 at a temperature of about 750° C. to 950° C. Alternatively, barrier oxide layer 320 may be deposited using a low pressure chemical vapor deposition (LPCVD) process performed at a temperature of about 400° C. to 800° C.

Layer 330 may be a nitride layer formed on layer 320 in a conventional manner to act as a protective cap during subsequent etching processes (act 210). In an exemplary implementation, nitride layer 330 may include a nitride, such as silicon nitride (e.g., $Si_3N_4$), and may have a thickness ranging from about 1000 Å to about 1700 Å. In one implementation consistent with principles of the invention, a suitable method for forming layer 330 may be chemical vapor deposition (CVD), although suitable alternative deposition techniques may also be employed.

Figure 4:
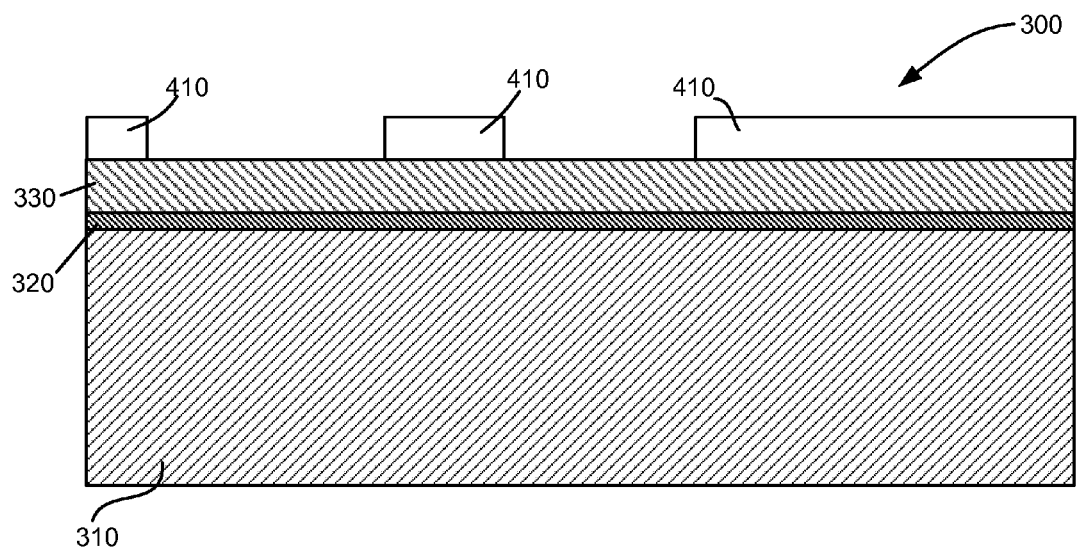
Figure 5:
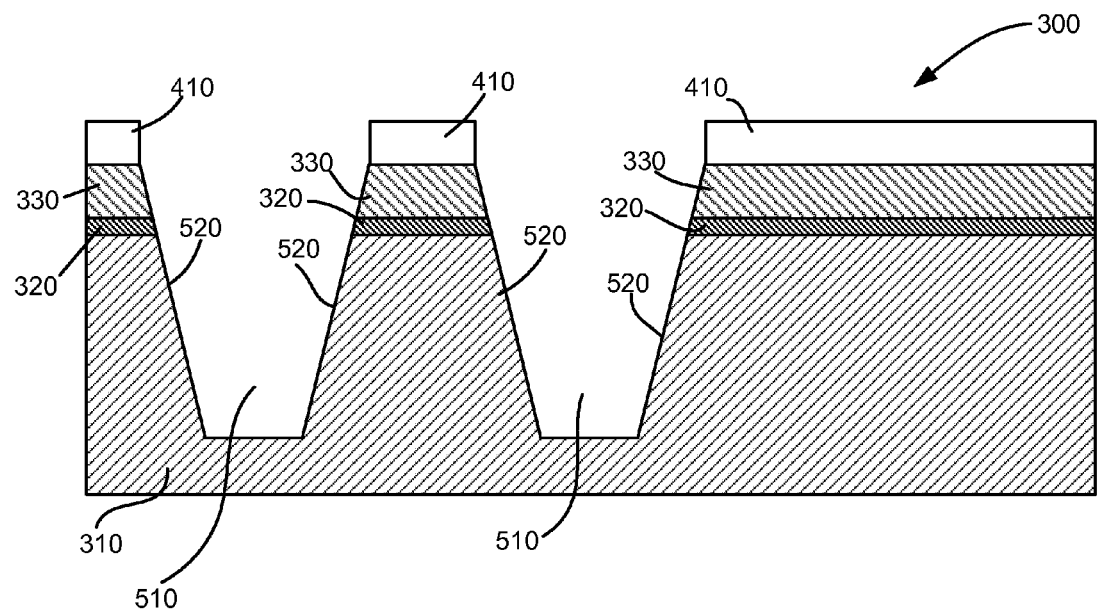
Figure 6:
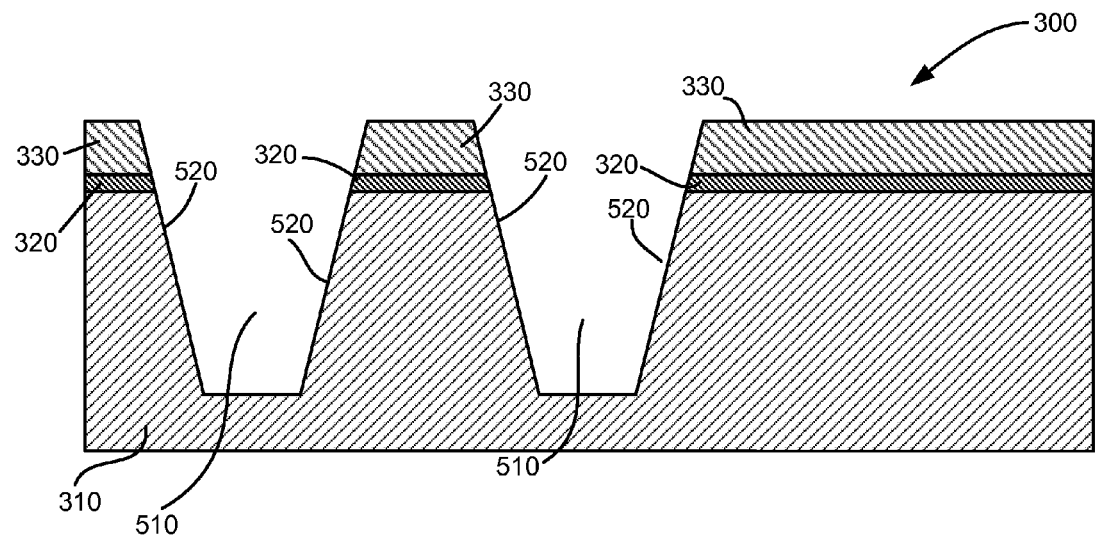

A photoresist material may be patterned and etched to form core trench masks 410 on the top surface of layer 330, as illustrated in FIG. 4 (act 215). Core trench masks 410 may be used to define active regions in the subsequently formed memory device and indicate areas that will not be etched during formation of core isolation regions in semiconductor device 300. Semiconductor device 300 may then be etched, as illustrated in FIG. 5, to remove portions of substrate 310, barrier oxide layer 320, and nitride layer 330 thereby forming core shallow trenches 510 (act 220). The etch may also be referred to as a shallow trench isolation (STI) etch. In one implementation consistent with principles of the invention, trenches 510 may be formed to include sloping sidewalls 520 that slope inward from the upper surface of nitride layer 330. Core trench masks 410 may then be removed (or cleaned), as illustrated in FIG. 6 (act 225). In one exemplary implementation, trench sidewalls 520 in nitride layer 330 may be separated by approximately 0.075 µm.

Figure 7:
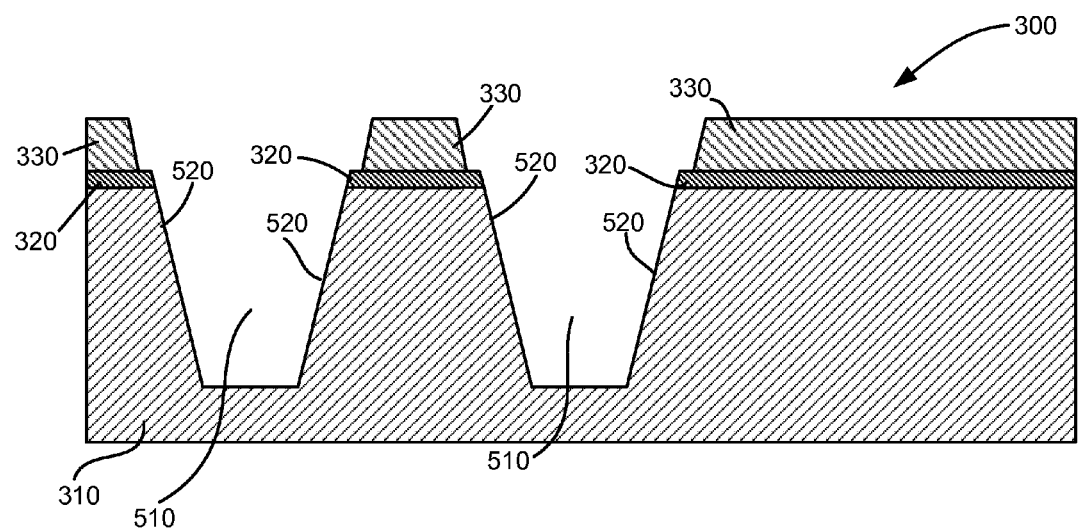

In accordance with one implementation consistent with principles of the invention, once masks 410 have been removed, a portion of nitride layer 330 adjacent to core trench sidewalls 520 may be trimmed or removed, as shown in FIG. 7 (act 230). In an exemplary implementation, nitride layer 330 may be trimmed back approximately 100 Å to 350 Å from trench sidewall 520. In accordance with the above implementation, such trimming may result in a nitride layer trench separation of approximately 0.109 μm. In one implementation consistent with principles of the invention, a suitable method for trimming nitride layer 330 may be a hot phosphoric acid etching that limits the etching to only the nitride material by a predetermined amount. Other suitable trimming or etching processes may also be used in a manner consistent with principles of the invention.

Figure 8:
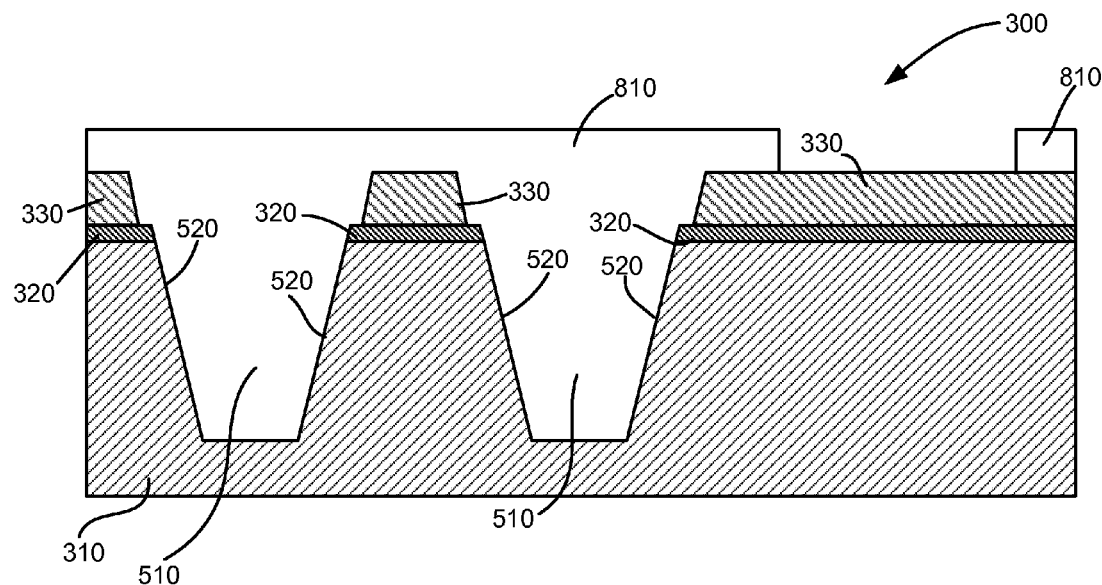
Figure 9:
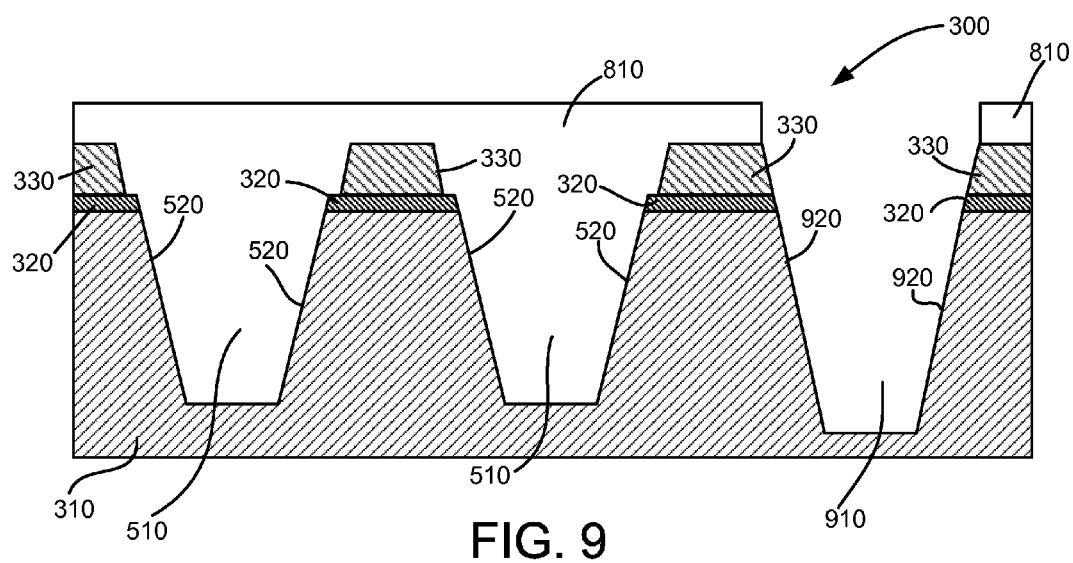
Figure 10:
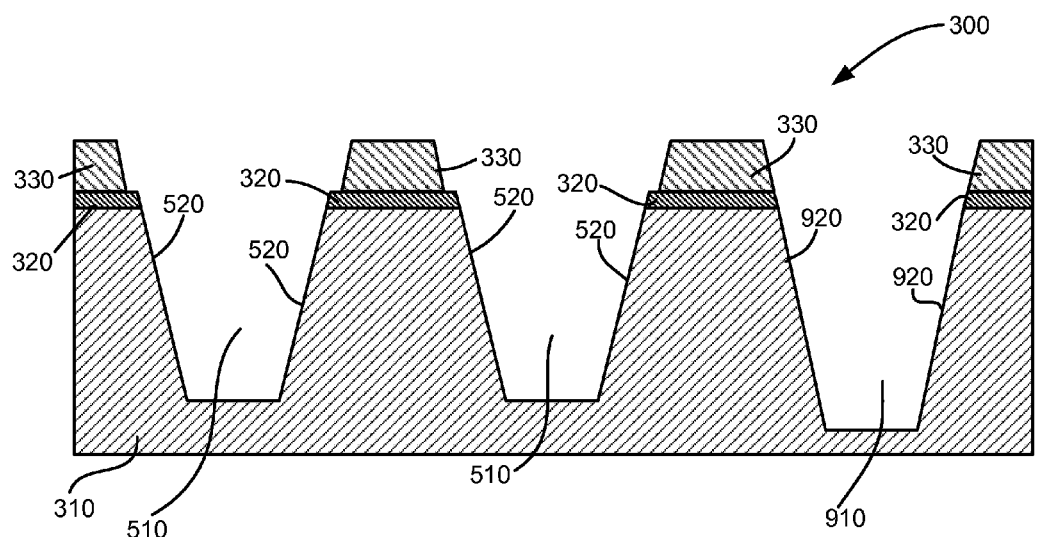

Following nitride layer trimming, a photoresist material may be patterned and etched to form periphery trench masks 810 on the top surface of layer 330, as illustrated in FIG. 8 (act 235). As with core trench masks 410, periphery trench masks 810 may be used to define active regions in the subsequently formed memory device and indicate areas that will not be etched during formation of core isolation regions in semiconductor device 300. Semiconductor device 300 may then be etched, as illustrated in FIG. 9, to remove portions of substrate 310, barrier oxide layer 320, and nitride layer 330 thereby forming periphery shallow trenches 910 having sidewalls 920 (act 240). Periphery trench masks 810 may then be removed (or cleaned), as illustrated in FIG. 10 (act 245).

Figure 11:
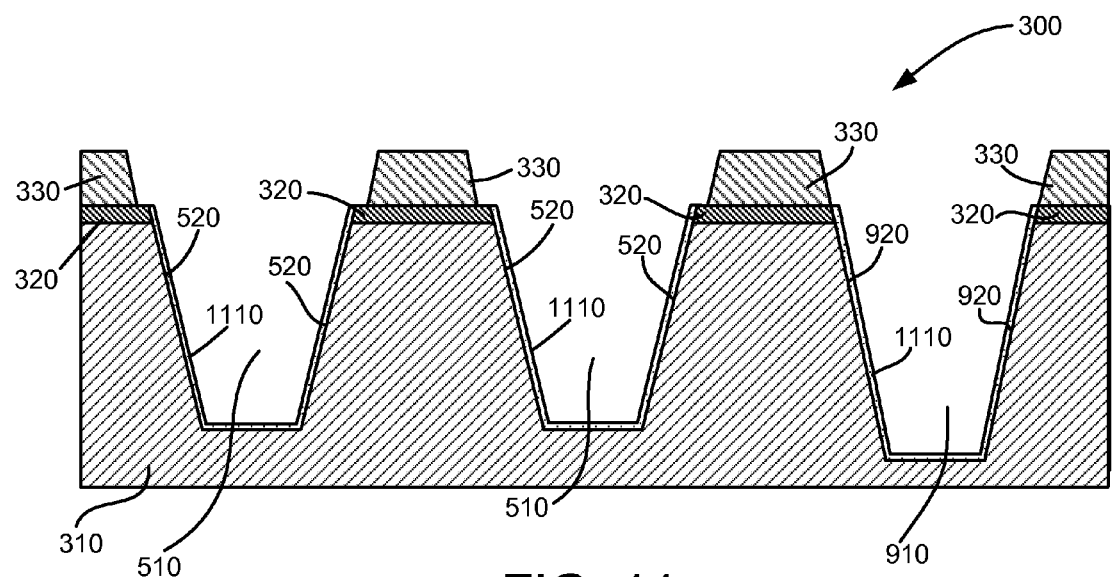

A liner oxide layer 1110 may be formed on sidewalls 520 and 920 of trenches 510 and 910, respectively, as shown in FIG. 11 (act 250). In one exemplary implementation, liner oxide layer 1110 may include an oxide, such as a silicon oxide (e.g., $SiO_2$), and may have a thickness ranging from about 50 Å to about 500 Å. In one implementation consistent with principles of the invention, a suitable method for forming layer 1110 may be a thermal oxidation process of layer 310 at a temperature of about 950° C. to 1100° C.

Figure 12:
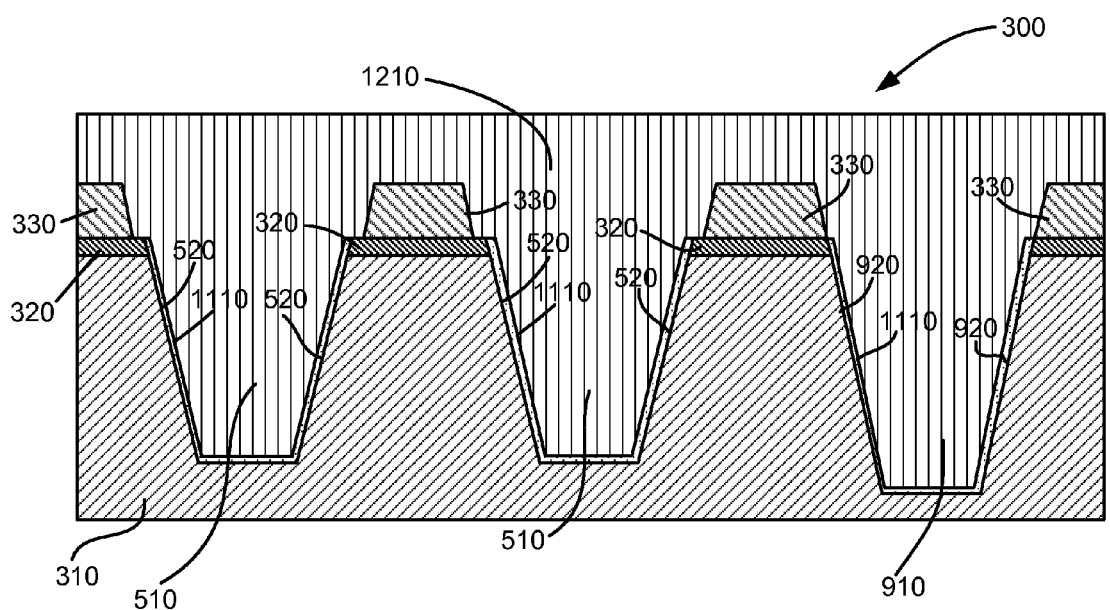

A field oxide (FOX) material 1210 may be formed on semiconductor device 300, as illustrated in FIG. 12 (act 255). In one implementation consistent with principles of the invention, FOX layer 1210 may be deposited by high density plasma chemical vapor deposition (HDP CVD), although suitable alternative deposition techniques may also be employed. In accordance with principles of the invention, trimming nitride layer 330 back from sidewalls 520 of core trenches 510, results in a FOX layer 1210 having an increased width at the top of trenches 510, resulting in improved performance of semiconductor 300.

Figure 13:
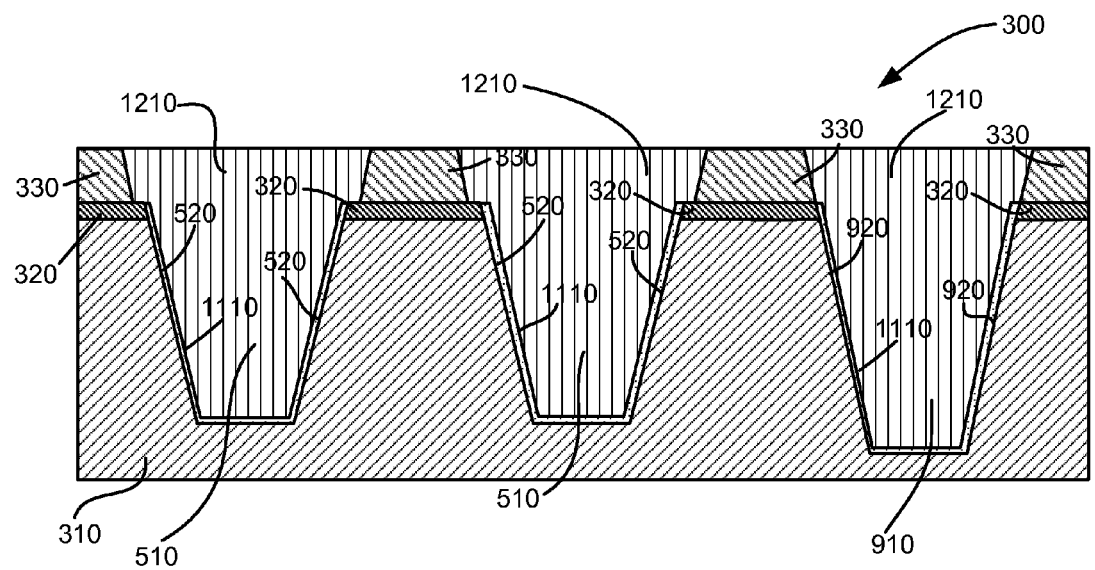
Figure 14:
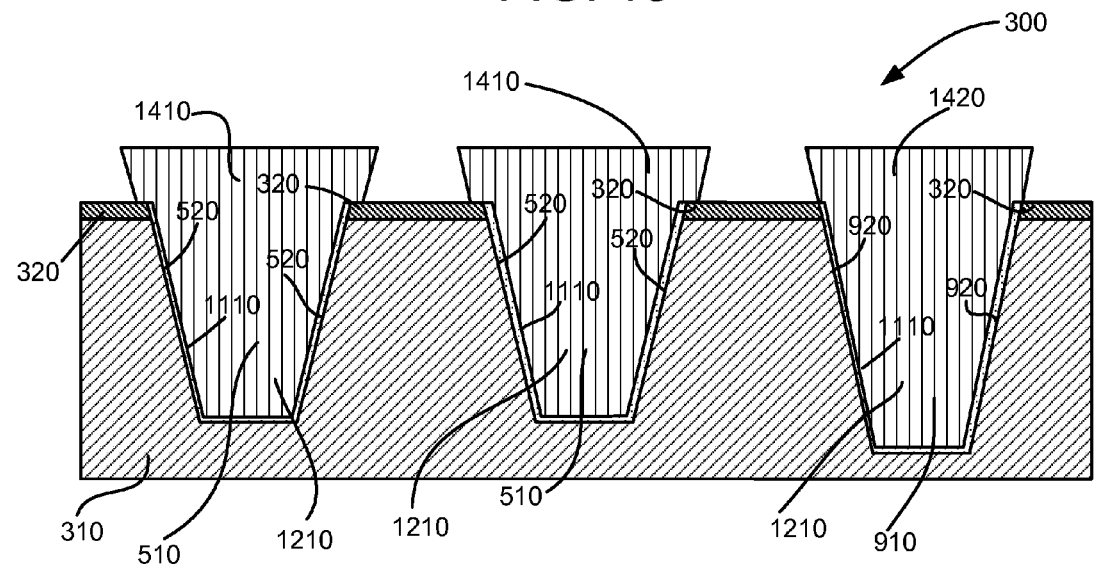

FOX layer 1210 may then be planarized using, for example, a chemical mechanical polishing (CMP) process to form a planar top surface aligned with a top surface of nitride layer 330, as illustrated, in FIG. 13 (act 260). Nitride layer 330 may then be stripped, as illustrated in FIG. 14 (act 265). In one exemplary implementation, a suitable method for stripping nitride layer 330 may be a hot phosphoric acid etching that limits the etching to only the nitride material. By stripping nitride layer 330, a portion of FOX layer 1210 remains extending above the top of trenches 510 and 910. This portion may be referred to as the mesa, with core mesas 1410 being formed over core trenches 510 and a periphery mesa 1420 being formed over periphery trench 910.

Figure 15:
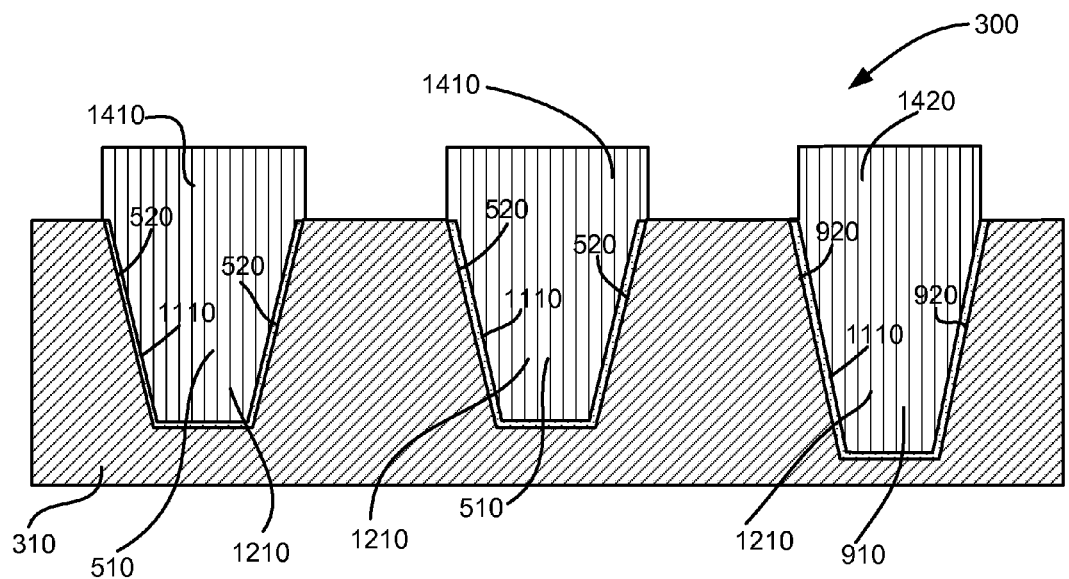
Figure 16:
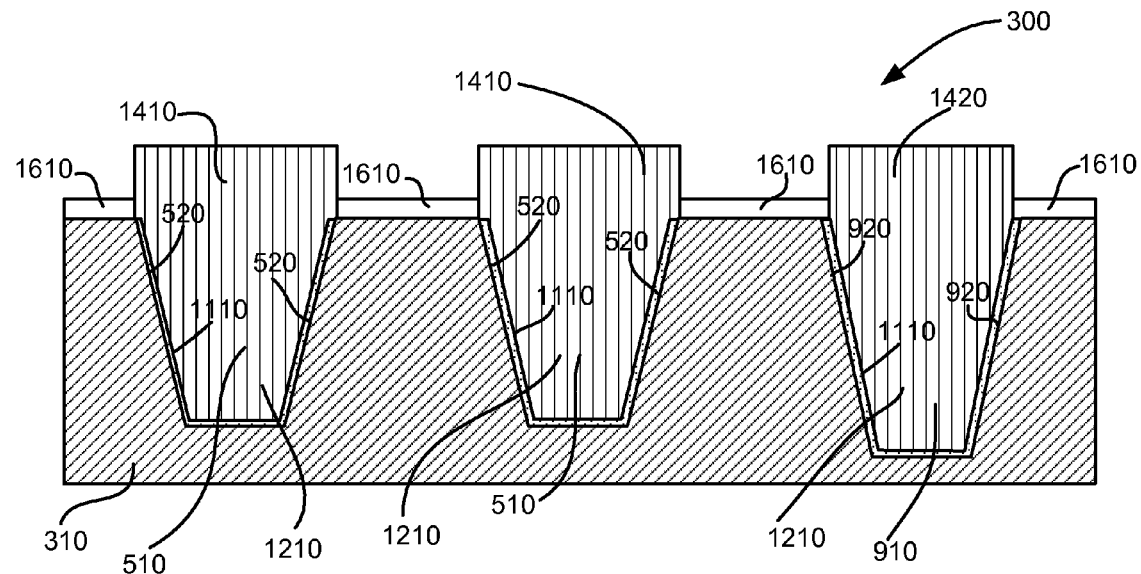
Figure 17:
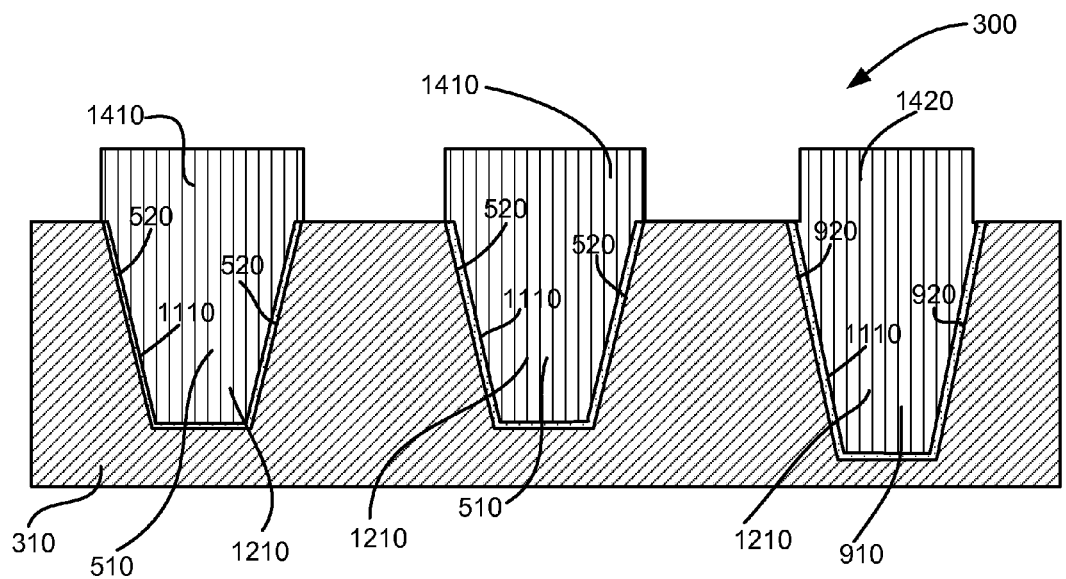

Barrier oxide layer 320 may then be stripped in a cleaning process, as shown in FIG. 15 (act 270). During the cleaning process, portions of FOX layer 1210 may be removed so as to reduce the width of mesas 1410 and 1420. A sacrificial oxide layer 1610 may then be formed over substrate 310, as shown in FIG. 16 (act 275). Oxide layer 1610 may then be stripped or cleaned, as shown in FIG. 17 (act 280). As with the cleaning process of act 270, the cleaning of act 280 also reduces the overall width of mesas 1410 and 1420. In one implementation consistent with principles of the invention, due to the nitride trimming of act 230, mesas 1410 may have a finished width of at least 35 nanometers.

Figure 18:
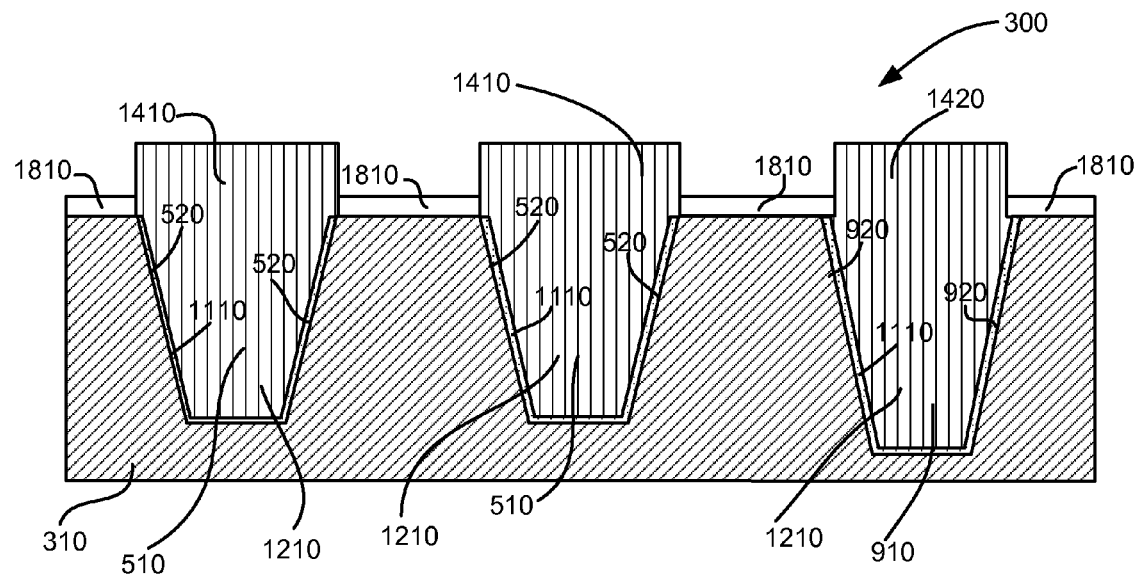

A dielectric layer 1810 may be formed on layer 310 in a conventional manner, as shown in FIG. 18 (act 285). In an exemplary implementation, dielectric layer 1810 may include an oxide, such as a silicon oxide (e.g., $SiO_2$), and may have a thickness ranging from about 50 Å to about 110 Å. Dielectric layer 1810 may function as a tunnel oxide layer for a subsequently formed memory cell of semiconductor device 300. In one implementation consistent with principles of the invention, a suitable method for forming layer 1810 may be thermal oxidation of layer 310 at a temperature of about 950° C. to 1100° C.

Figure 19:
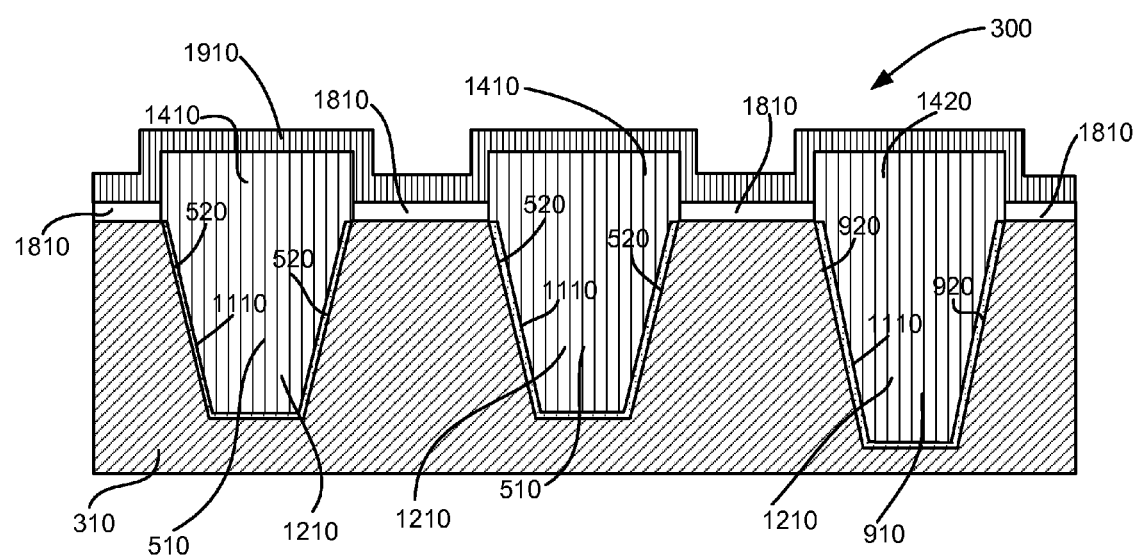

A layer 1910 may be formed on layer 1810 and mesas 1410 and 1420 in a conventional manner and may include a material, such as polysilicon or silicon nitride, as shown in FIG. 19 (act 290). Layer 1910, consistent with principles of the invention, may act as a charge storage or floating gate layer for semiconductor device 300 and may have a thickness ranging from about 400 Å to about 900 Å. Following floating gate formation, suitable additional steps may also be performed in fabricating semiconductor device 300. For example, an intergate dielectric layer, at least one control gate, and source/drain regions may be formed in semiconductor device 300. Details regarding such processes are well within the scope of the art and will not be described in detail herein.

Figure 20:
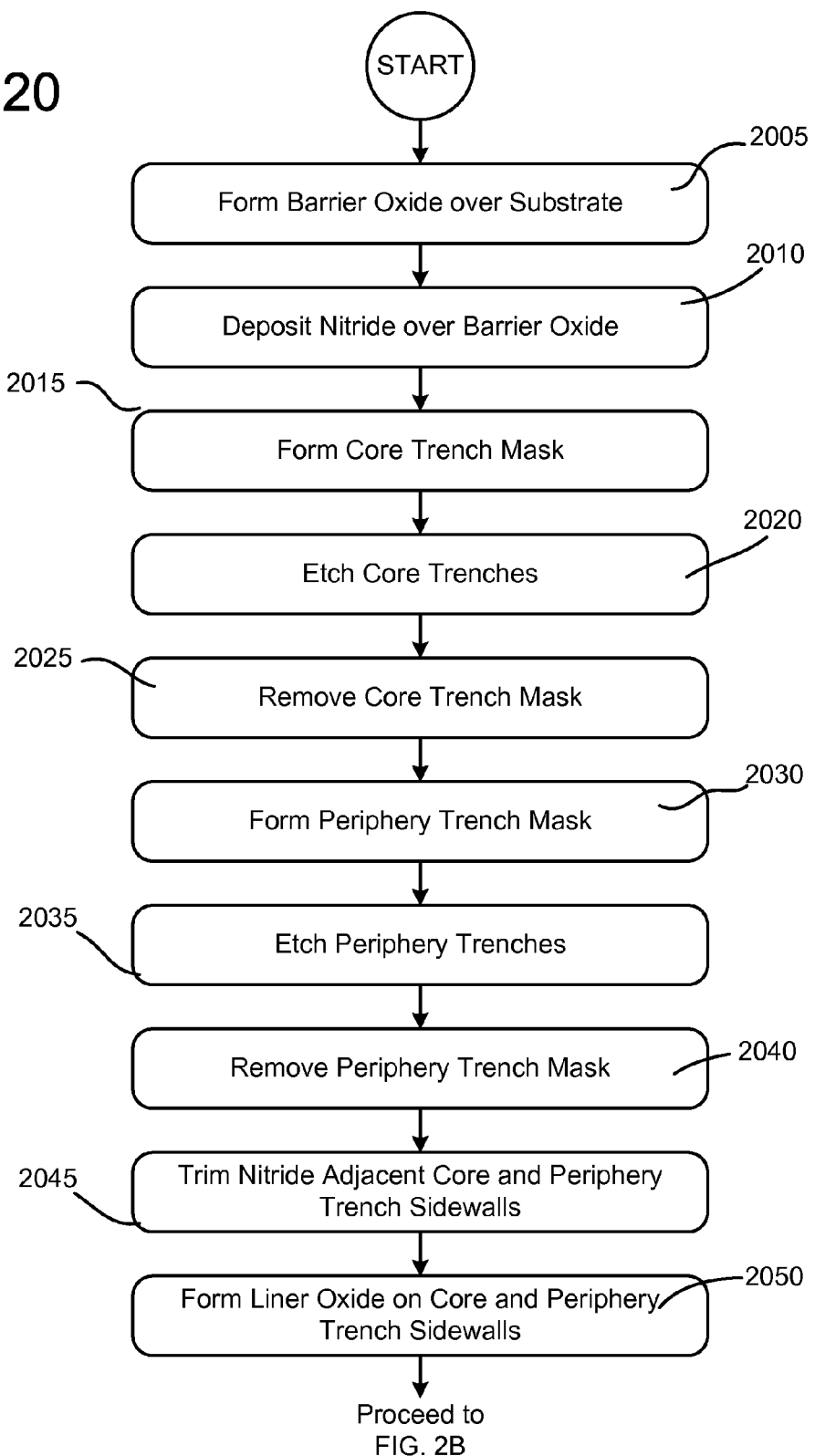
FIG. 20 is a flow diagram illustrating another exemplary process for forming a semiconductor memory device in an implementation consistent with principles of the invention.
Figure 21:
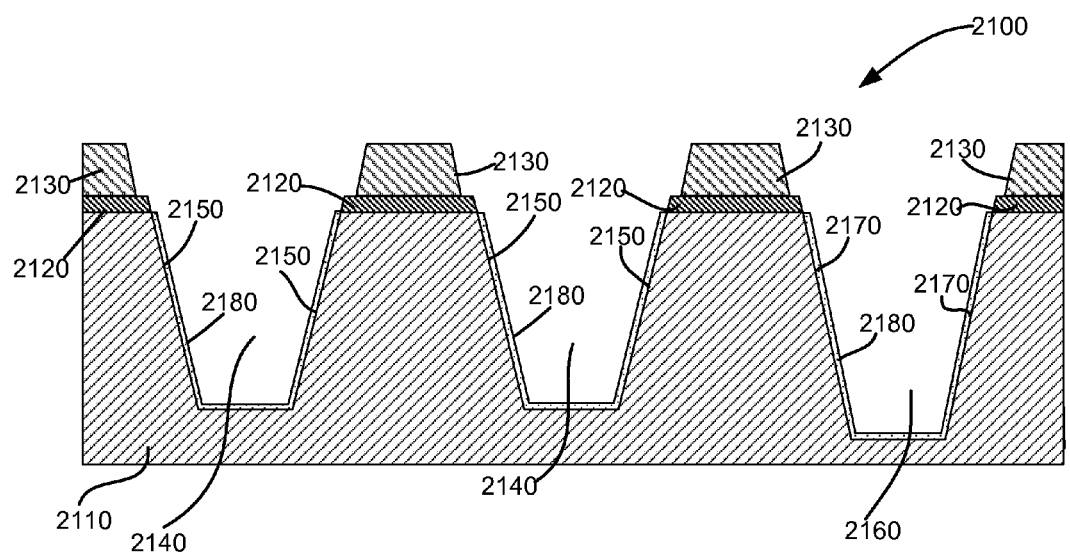
FIG. 21 illustrates an exemplary view of a semiconductor memory device fabricated according to the processing described in FIG. 20.

FIG. 20 illustrates an exemplary process for forming a semiconductor memory device in a second implementation consistent with the principles of the invention. The semiconductor memory device includes an array of memory cells of a flash memory device, such as that illustrated in FIG. 1. FIG. 21 illustrates an exemplary view of a semiconductor memory device fabricated according to the processing described in FIG. 20.

Processing may begin with a semiconductor device 2100 that includes a substrate 2110, a sacrificial barrier oxide layer 2120 (act 2005), and a nitride layer 2130 (act 2010) formed substantially as described, with respect to FIGS. 2A and 3.

A photoresist material may be patterned and etched to form core trench masks on the top surface of layer 2130 (act 2015). Semiconductor device 2100 may then be etched to remove portions of substrate 2110, barrier oxide layer 2120, and nitride layer 2130 thereby forming core shallow trenches 2140 having sidewalls 2150 (act 2020). Core trench masks may then be removed (or cleaned) (act 2025).

In accordance with one implementation consistent with principles of the invention, once the core trench masks have been removed, a photoresist material may be patterned and etched to form periphery trench masks on the top surface of layer 2130 (act 2030). Semiconductor device 2100 may then be etched, as illustrated in FIG. 21, to remove portions of substrate 2110, barrier oxide layer 2120, and nitride layer 2130 thereby forming a periphery shallow trench 2160 having sidewalls 2170 (act 240). The periphery trench masks may then be removed (or cleaned) (act 2040).

Following core and periphery trench formation, a portion of nitride layer 2130 adjacent to both the core and periphery trench sidewalls 2150 and 2170 may be trimmed or removed, as shown in FIG. 21 (act 2045). In an exemplary implementation, nitride layer 2130 may be trimmed back approximately 100 Å to 350 Å from trench sidewalls 2150 and 2170. In one implementation consistent with principles of the invention, a suitable method for trimming nitride layer 2130 may be a hot phosphoric acid etching that limits the etching to only the nitride material by a predetermined amount. Other suitable trimming or etching processes may also be used in a manner consistent with principles of the invention.

A liner oxide layer 2180 may be formed on sidewalls 2150 and 2170 of trenches 2140 and 2160, respectively, as shown in FIG. 21 (act 2050). In one exemplary implementation, liner oxide layer 2180 may include an oxide, such as a silicon oxide (e.g., $SiO_2$), and may have a thickness ranging from about 50 Å to about 350 Å. The semiconductor device fabrication process may then proceed to act 255, as shown in FIG. 2B for continued device fabrication.

Figure 22:
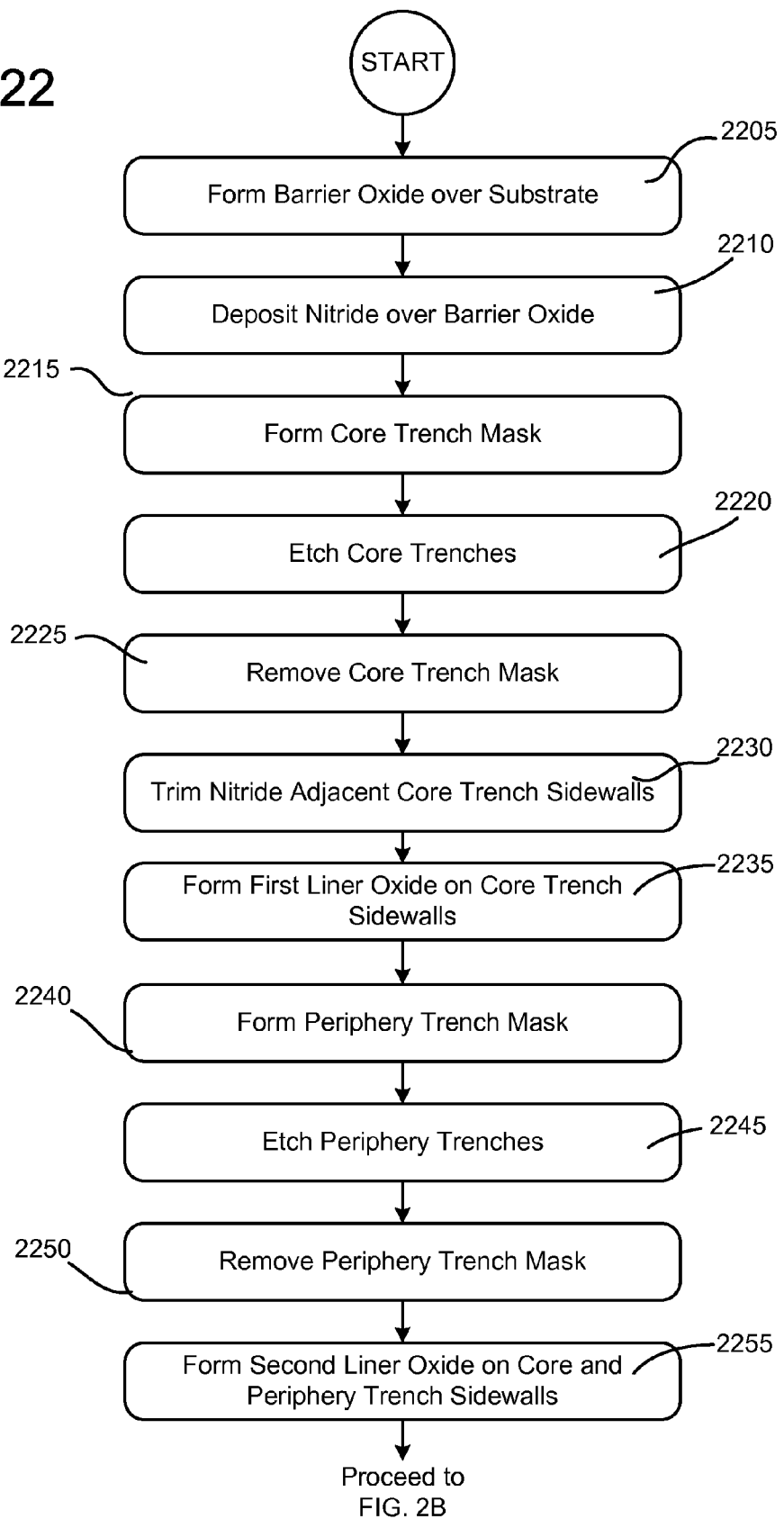
FIG. 22 is a flow diagram illustrating yet another exemplary process for forming a semiconductor memory device in an implementation consistent with principles of the invention.
Figure 23:
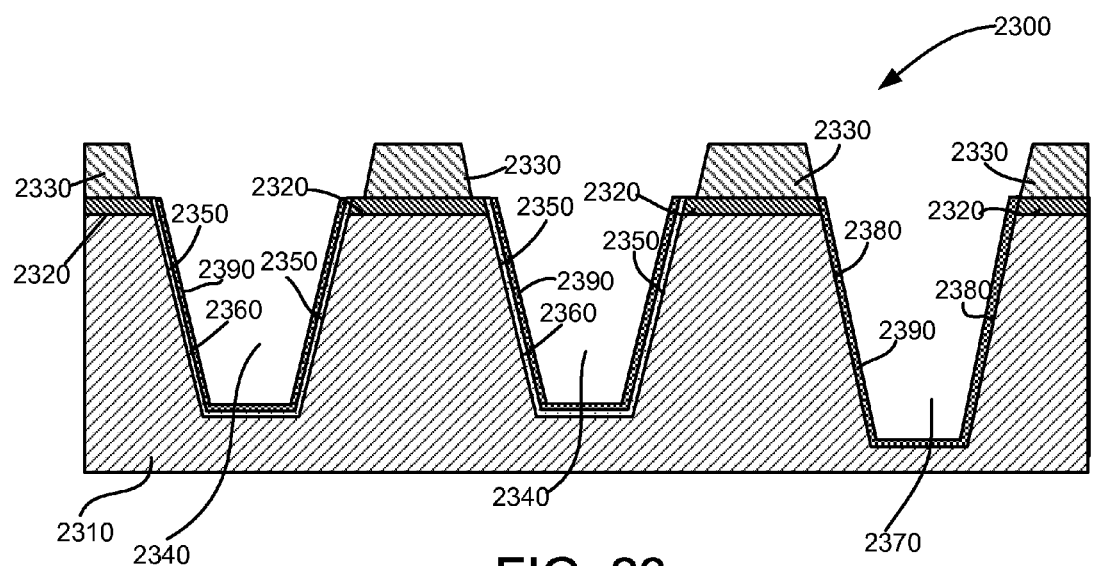
FIG. 23 illustrates an exemplary view of a semiconductor memory device fabricated according to the processing described in FIG. 22.

FIG. 22 illustrates an exemplary process for forming a semiconductor memory device in a third implementation consistent with the principles of the invention. The semiconductor memory device includes an array of memory cells of a flash memory device, such as that illustrated in FIG. 1. FIG. 23 illustrates an exemplary view of a semiconductor memory device fabricated according to the processing described in FIG. 22.

Processing may begin with a semiconductor device 2300 that includes a substrate 2310, a sacrificial barrier oxide layer 2320 (act 2205), and a nitride layer 2330 (act 2210) formed substantially as described, with respect to FIGS. 2A and 3.

A photoresist material may be patterned and etched to form core trench masks on the top surface of layer 2330 (act 2215). Semiconductor device 2300 may then be etched to remove portions of substrate 2310, barrier oxide layer 2320, and nitride layer 2330 thereby forming core shallow trenches 2340 having sidewalls 2350 (act 2220). Core trench masks may then be removed (or cleaned) (act 2225).

In accordance with one implementation consistent with principles of the invention, once the core trench masks have been removed, a portion of nitride layer 2330 adjacent to core trench sidewalls 2350 may be trimmed or removed, as shown in FIG. 23 (act 2230). In an exemplary implementation, nitride layer 2330 may be trimmed back approximately 100 Å to 350 Å from trench sidewalls 2350. In one implementation consistent with principles of the invention, a suitable method for trimming nitride layer 2330 may be a hot phosphoric acid etching that limits the etching to only the nitride material by a predetermined amount. Other suitable trimming or etching processes may also be used in a manner consistent with principles of the invention.

Following nitride trimming, a first liner oxide 2360 may be formed on trench 2340 (act 2235). In one exemplary implementation, first liner oxide layer 2360 may include an oxide, such as a silicon oxide (e.g., $SiO_2$), and may have a thickness ranging from about 50 Å to about 500 Å.

A photoresist material may be patterned and etched to form periphery trench masks on the top surface of layer 2330 (act 2240). Semiconductor device 2300 may then be etched, as illustrated in FIG. 23, to remove portions of substrate 2310, barrier oxide layer 2320, and nitride layer 2330 thereby forming a periphery shallow trench 2370 having sidewalls 2380 (act 2245). The periphery trench masks may then be removed (or cleaned) (act 2250).

A second liner oxide layer 2390 may be formed on sidewalls 2350 and 2380 of trenches 2340 and 2370, respectively, as shown in FIG. 23 (act 2255). In one exemplary implementation, second liner oxide layer 2390 may include an oxide, such as a silicon oxide (e.g., $SiO_2$), and may have a thickness ranging from about 50 Å to about 500 Å. The semiconductor device fabrication process may then proceed to act 255, as shown in FIG. 2B for continued device fabrication.

Figure 24:
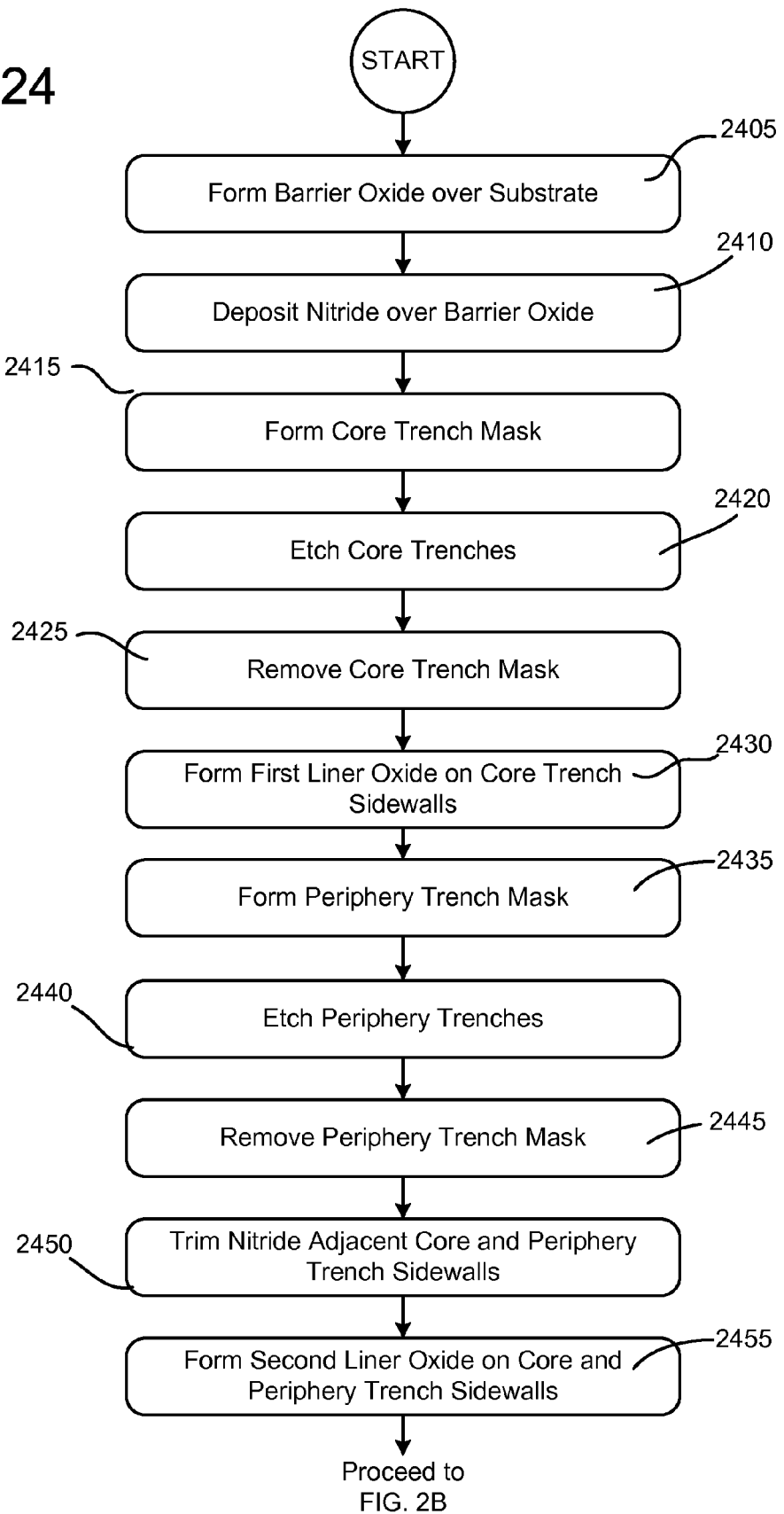
FIG. 24 is a flow diagram illustrating still another exemplary process for forming a semiconductor memory device in an implementation consistent with principles of the invention.
Figure 25:
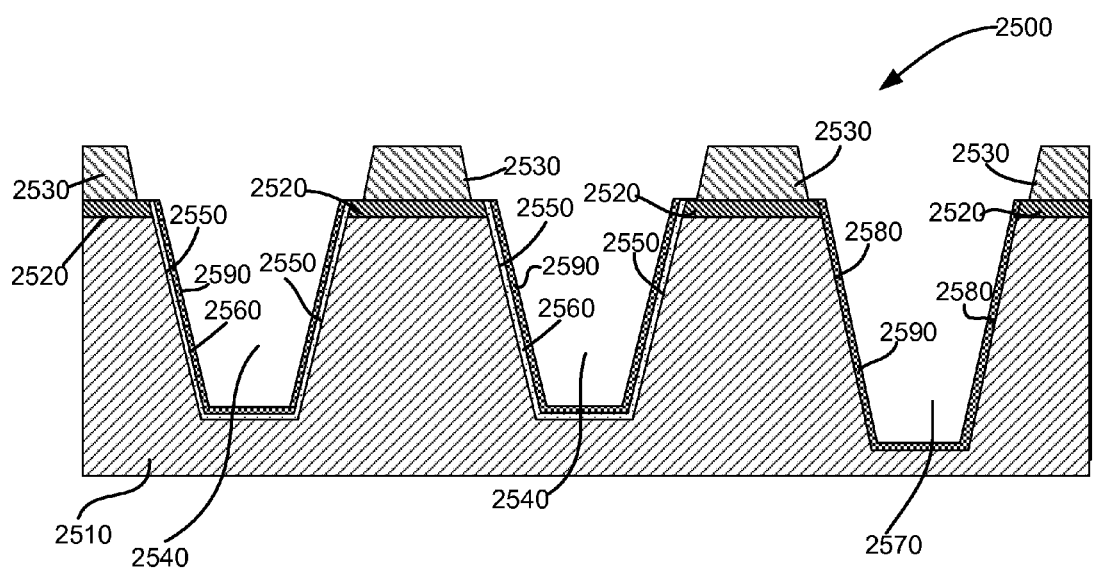
FIG. 25 illustrates an exemplary view of a semiconductor memory device fabricated according to the processing described in FIG. 24.

FIG. 24 illustrates an exemplary process for forming a semiconductor memory device in a fourth implementation consistent with the principles of the invention. The semiconductor memory device includes an array of memory cells of a flash memory device, such as that illustrated in FIG. 1. FIG. 25 illustrates an exemplary view of a semiconductor memory device fabricated according to the processing described in FIG. 24.

Processing may begin with a semiconductor device 2500 that includes a substrate 2510, a sacrificial barrier oxide layer 2520 (act 2405), and a nitride layer 2530 (act 2410) formed substantially as described, with respect to FIGS. 2A and 3.

A photoresist material may be patterned and etched to form core trench masks on the top surface of layer 2530 (act 2415). Semiconductor device 2500 may then be etched to remove portions of substrate 2510, barrier oxide layer 2520, and nitride layer 2530 thereby forming core shallow trenches 2540 having sidewalls 2550 (act 2420). Core trench masks may then be removed (or cleaned) (act 2425).

A first liner oxide 2560 may be formed on trench 2540 (act 2430). In one exemplary implementation, first liner oxide layer 2560 may include an oxide, such as a silicon oxide (e.g., $SiO_2$), and may have a thickness ranging from about 50 Å to about 500 Å.

A photoresist material may be patterned and etched to form periphery trench masks on the top surface of layer 2530 (act 2435). Semiconductor device 2500 may then be etched, as illustrated in FIG. 25, to remove portions of substrate 2510, barrier oxide layer 2520, and nitride layer 2530 thereby forming a periphery shallow trench 2570 having sidewalls 2580 (act 2440). The periphery trench masks may then be removed (or cleaned) (act 2445).

In accordance with one implementation consistent with principles of the invention, once the core and periphery trenches have been formed, a portion of nitride layer 2530 adjacent to core trench sidewalls 2550 and periphery trench sidewalls 2580 may be trimmed or removed, as shown in FIG. 25 (act 2450). In an exemplary implementation, nitride layer 2530 may be trimmed back approximately 100 Å to 350 Å from trench sidewalls 2550 and 2580. In one implementation consistent with principles of the invention, a suitable method for trimming nitride layer 2530 may be a hot phosphoric acid etching that limits the etching to only the nitride material by a predetermined amount. Other suitable trimming or etching processes may also be used in a manner consistent with principles of the invention.

Following nitride trimming, a second liner oxide layer 2590 may be formed on sidewalls 2550 and 2580 of trenches 2540 and 2570, respectively, as shown in FIG. 25 (act 2455). In one exemplary implementation, second liner oxide layer 2590 may include an oxide, such as a silicon oxide (e.g., $SiO_2$), and may have a thickness ranging from about 50 Å to about 500 Å. The semiconductor device fabrication process may then proceed to act 255, as shown in FIG. 2B for continued device fabrication.

As illustrated, a semiconductor device is provided with a number of memory cells that each include a tunnel oxide layer and a floating gate, formed over a tunnel oxide layer and a number of field oxide mesas. By trimming a previous nitride layer prior to formation of the field oxide mesas, a final width of the field oxide mesas may be maximized, thereby advantageously enhancing the performance of the semiconductor device.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention.

However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIGS. 2, 20, 22, and 24, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. An apparatus comprising:
   a substrate comprising at least one isolation trench and a periphery trench formed therein,
      the at least one isolation trench being a core trench;
   a liner oxide formed over a sidewall of the at least one isolation trench,
      the liner oxide comprising a first liner oxide formed over the sidewall of the core trench;
   a tunnel oxide formed over the substrate;
   an oxide material formed in the at least one isolation trench and including a portion extending above an upper surface of the tunnel oxide,
      the portion extending above the upper surface of the tunnel oxide forming a first mesa that extends over the liner oxide and has a width of at least 35 nm;
   a second liner oxide formed over a sidewall of the periphery trench,
      the first mesa extending over the first liner oxide formed over the sidewall of the core trench,
      a second mesa not extending over the second liner oxide formed over the sidewall of the periphery trench, and
      the second mesa being formed above the periphery trench and being narrower than the first mesa;
   a floating gate formed over the tunnel oxide and the first mesa,
      the floating gate extending across an entire length of an upper surface of the first mesa; and
   a control gate formed over the floating gate.

2. The apparatus of claim 1, where the oxide material is a high density plasma (HDP) field oxide material.

3. The apparatus of claim 1, where the sidewall of the at least one isolation trench is separated from a sidewall of another isolation trench, formed in the substrate, by 0.075 μm.

4. The apparatus of claim 1, where the liner oxide includes a silicon oxide comprising a thickness ranging from 50 Å to 100 Å.

5. The apparatus of claim 1, where the tunnel oxide includes a silicon oxide comprising a thickness ranging from 50 Å to 110 Å.

6. The apparatus of claim 1, where the floating gate comprises a thickness ranging from 400 Å to 900 Å.

7. An apparatus comprising:
   a substrate comprising a core trench and a periphery trench, the core trench and the periphery trench being formed in the substrate;
   a first liner oxide formed over a sidewall of the core trench;
   a second liner oxide formed over a sidewall of the periphery trench;
   a tunnel oxide formed over the substrate;
   a first oxide material formed in the core trench,
      the first oxide material including a first portion that extends above an upper surface of the tunnel oxide, and
      the first portion forming a first mesa that extends over the first liner oxide and has a width of at least 35 nm;
   a second oxide material formed over a sidewall of the periphery trench,
      the second oxide material including a second portion that extends above the upper surface of the tunnel oxide,
      the second portion forming a second mesa that is narrower than the first mesa, and
      the second mesa not extending over the second liner oxide formed over the sidewall of the periphery trench;
   a floating gate formed over the tunnel oxide and the first mesa,
      the floating gate extending across an upper surface of the first mesa; and
   a control gate formed over the floating gate.

8. The apparatus of claim 7, where the first oxide material is a high density plasma (HDP) field oxide material.

9. The apparatus of claim 7, where a sidewall of the core trench is separated from a sidewall of another core trench, formed in the substrate, by 0.075 μm.

10. The apparatus of claim 7, where the first liner oxide includes a silicon oxide comprising a thickness ranging from 50 Å to 100 Å.

11. The apparatus of claim 7, where the tunnel oxide includes a silicon oxide comprising a thickness ranging from 50 Å to 110 Å.

12. The apparatus of claim 7, where the floating gate comprises a thickness ranging from 400 Å to 900 Å.

13. The apparatus of claim 1, where
   the at least one isolation trench includes two isolation trenches,
   each of the two isolation trenches are core trenches, and
   the core trench corresponds to a first core trench of the core trenches.

14. The apparatus of claim 13, further comprising:
   a third mesa extending over the first liner oxide formed over a sidewall of a second core trench of the core trenches.

15. The apparatus of claim 14, where the floating gate is formed over the tunnel oxide and the third mesa.

16. The apparatus of claim 14, where the second mesa is narrower than the third mesa.

17. The apparatus of claim 7, where
   the at least one isolation trench includes two isolation trenches,
   each of the two isolation trenches are core trenches, and
   the core trench corresponds to a first core trench of the core trenches.

18. The apparatus of claim 17, further comprising:
   a third mesa extending over the first liner oxide formed over a sidewall of a second core trench of the core trenches.

19. The apparatus of claim 18, where the floating gate is formed over the tunnel oxide and the third mesa.

20. The apparatus of claim 18, where the second mesa is narrower than the third mesa.

\* \* \* \* \*